United States Patent [19]

Koenig

[11] Patent Number: 5,241,698
[45] Date of Patent: Aug. 31, 1993

[54] RADIO RECEIVER OPERATIONAL CHECKING METHOD AND SYSTEM INCLUDING REACTIVE COUPLING

[76] Inventor: Robert H. Koenig, R.D. #1 Coats Rd., Burdett, N.Y. 14818

[21] Appl. No.: 657,499

[22] Filed: Feb. 19, 1991

Related U.S. Application Data

[63] Continuation-in-part of Ser. No. 427,725, Oct. 26, 1989, Pat. No. 4,996,717.

[51] Int. Cl.⁵ .......................... H04B 1/10; H04Q 7/00
[52] U.S. Cl. ................................... 455/222; 455/35.1; 455/225
[58] Field of Search ................... 455/35, 36, 154, 156, 455/218, 219, 221, 222, 223, 224, 225, 226, 132, 269, 272, 280, 282, 143; 375/104; 379/58; 340/311, 1

[56] References Cited

U.S. PATENT DOCUMENTS

| | | |
|---|---|---|
| 2,982,854 | 5/1961 | Durkee . |
| 2,992,327 | 7/1961 | Lennon et al. . |
| 3,015,728 | 1/1962 | Richman . |
| 3,038,071 | 6/1962 | Durkee . |
| 3,102,236 | 8/1963 | Eichenerger et al. . |
| 3,296,535 | 1/1967 | Murray . |
| 3,339,144 | 8/1967 | Squires . |
| 3,350,650 | 10/1967 | Kemper . |
| 3,873,926 | 3/1975 | Wright . |
| 3,894,285 | 7/1975 | Schaeperkoetter . |
| 4,020,421 | 4/1977 | Elder et al. . |
| 4,044,309 | 8/1977 | Smith . |
| 4,241,453 | 12/1980 | Drake ................................ 455/219 |
| 4,455,682 | 6/1984 | Masters ............................... 455/300 |
| 4,703,507 | 10/1987 | Holden ................................. 381/94 |
| 4,718,115 | 1/1988 | Inoue .................................. 455/218 |
| 4,724,545 | 2/1988 | Hamada .............................. 455/218 |
| 4,731,873 | 3/1988 | Voyce ................................. 455/219 |
| 4,996,717 | 2/1991 | Koening .............................. 455/223 |

Primary Examiner—Reinhard J. Eisenzopf
Assistant Examiner—Lisa Charouel
Attorney, Agent, or Firm—Barnard & Brown

[57] ABSTRACT

A clock-driven pulse source is used to apply repetitive short pulses to the squelch control point of the squelch circuitry of a radio receiver to deactivate momentarily the squelch circuitry at regular intervals (FIGS. 2B, and 2D). The repetitive short pulses being applied to the active squelch circuitry of a radio receiver to deactivate it momentarily at regular intervals may, according to the present invention, be applied directly or through reactive coupling to the antenna associated with the radio receiver (FIGS. 2M and 2N). This provides periodic noise bursts of "de-squelch" pulses on an otherwise silent radio in order to inform the radio operator that the radio is live and that the volume is adequate. A light may also be connected to the system to provide a second, visual, indicator of the operational status of the radio. This radio receiver operational checking system may also be utilized where there are two or more radios in use with a common audio headphone/speaker line, by providing an additional clock-driven pulse source for each radio in use. The system may be arranged so that the status of individual radios may be quickly ascertained by sound and/or by light indicators.

13 Claims, 4 Drawing Sheets

Fig. 2A 
Clock Signal

Fig. 2B 
Radio 1 De-Squelch Pulses

Fig. 2M 
Radio 1 De-Squelch RF Pulse Signal

Fig. 2C 
Radio 2 Spacer Pulse for Dual De-Squelch

Fig. 2D 
Radio 2 De-Squelch Pulse

Fig. 2N 
Radio 2 De-Squelch RF Pulse Signal

Fig. 2E 
Noise Bursts from Headphone Line -Amplified

Fig. 2F 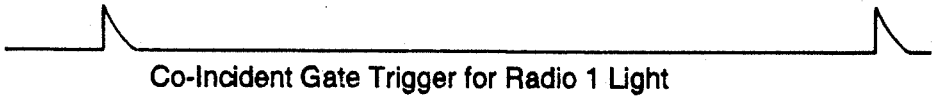
Co-Incident Gate Trigger for Radio 1 Light

Fig. 2G 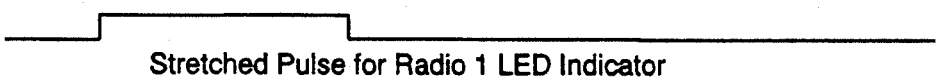
Stretched Pulse for Radio 1 LED Indicator

Fig. 2H 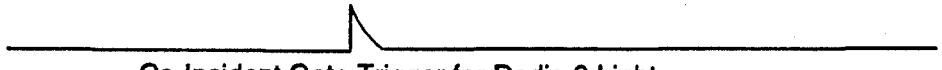
Co-Incident Gate Trigger for Radio 2 Light

Fig. 2J 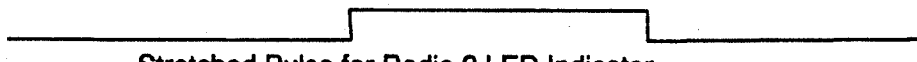
Stretched Pulse for Radio 2 LED Indicator

Fig. 2K 
Voice Signal Sensing at Headphones
(amplified, rectified, integrated)

Fig. 2L 
Light Disabling Signal

RADIO RECEIVER OPERATIONAL CHECKING METHOD AND SYSTEM INCLUDING REACTIVE COUPLING

This application is a continuation-in-part of patent patent application number 07/427,725, filed Oct. 26, 1989, Robert H. Koenig inventor now U.S. Pat. No. 4,996,717.

BACKGROUND OF THE INVENTION

1. Field of the Invention

This invention relates to a radio receiver operational checking system using the radio receiver's active signal squelch circuit to measure the operability of a radio receiver including identifying which receiver is being checked where a plurality of radio receivers are being monitored.

2. Description of the Related Art

For years, radio receivers used in aircraft, military, mobile and other, critical radiant-energy communication links have used circuitry known as "squelch" to make the receiver silent until a "threshold" signal strength is reached, at which time full listening power is activated. Receivers with squelch have a knob for the operator to adjust to the critical silencing point, or "threshold." In some receivers, the adjustment is preset and a pull-knob disables squelch entirely, giving full background noise when volume is turned up. Without the squelch circuitry, there is a continual noise in the form of loud hissing or crackling, commonly known as background noise. The noise is distracting and unpleasant; hence, the use of squelch circuitry systems.

For example, in aviation, where almost everything is duplicated, it is common practice to install two receivers, one for standby, even in small aircraft. Often, as in aircraft, a single common speaker or headphone line is used for multiple receivers, and this invention accommodates this common audio output arrangement. Although failure is unlikely, the chance exists that any one of the thousands of electronic components in each of the receivers may cause a system failure. If so, there is nothing to indicate when a squelch-silenced receiver becomes a dead receiver. This could be serious if the aircraft is being flown on instruments in the clouds, if the controller must be heard in order to keep the plane, pilot and passengers safe, or in any number of other situations where it is crucial to have an operative radio.

Some pilots and communicators disable squelch and tolerate the noise in order to know that the radio is live. Others leave the squelch control on and trust blindly to fate. Still others bungle and foul up their communication by inadvertently having the radio turned down or off.

U.S. Pat. No. 4,718,115 (Inoue), entitled "RADIO RECEIVER FOR CARRYING OUT SELF DIAGNOSIS WITHOUT INTERFERENCE," is of interest as a general reference in this case as it discloses the category of prior art where a separate diagnostic signal is introduced in the path of the incoming signal as it goes through the radio receiver. This category of prior art is distinctively different from the present invention in that the invention, which is to be described herein, periodically deactivates the squelch circuitry as a method of determining the operational status of the radio and does not use a separate diagnostic signal.

SUMMARY OF THE INVENTION

In the following discussion, subliminal or near-subliminal refers to pulse duration which is long enough to be heard without being intrusive or annoying.

This invention solves the problem of determining the operational status of squelch-silenced radios, and further adds the option of having an effectively silent radio when no voice is present, by providing near-subliminal short bursts of full-sensitivity receiver noise to indicate that the radio is operational and that the volume is adequately adjusted. In addition, if more than one radio is being used, the system indicates which of the radios are properly live.

It is therefore an object of this invention to provide a monitoring means for radio receivers which employ squelch silencing, particularly the type used in aircraft communications, as well as other types of communications.

It is another object of this invention to provide means to indicate which of several radios are active and truly live, even though the receiver is essentially silenced by squelch.

It is still another object of this invention to provide means for giving radio operators assurance that their receiving equipment has not failed and is live, even though the speaker or headphones are essentially silenced by squelch.

It is still another object of this invention to prevent inadvertent mix-ups of adjustment of multiple communication radios or other communication set-up on an aircraft.

It is still another object of this invention to provide means for informing a pilot or radio operator coming new on the watch that there is reception and which particular radios are live and adjusted to adequate listening volume.

The foregoing objectives are achieved by the present invention by means of a clock driven pulse source for each radio receiver to provide repetitive narrow signals to override or deactivate momentarily the active radio noise squelch circuit of each radio receiver at regular intervals, to give indication that the said radio receiver is operational and awaiting a radio frequency signal. Some receivers, having an active radio noise squelch circuit, also contain a squelch test pin to which can be applied the repetitive short duration signal voltage pulse of this invention to deactivate momentarily each radio's noise squelching at regular intervals, to give indication that the said radio receiver is operational and awaiting a radio frequency signal. However, in those cases where the existing radio receiver has an active noise squelch circuit system but does not have a squelch control connect test point, the aforesaid clock driven pulse source for each radio receiver can be short duration radio frequency signals generated by a wide spectrum radio frequency generator reactively connected to the radio receiver's antenna to override momentarily that radio receiver's noise squelch system at regular intervals to give an indication that the said radio is operational and awaiting a radio frequency signal. Short unobtrusive noise bursts from a headphone or speaker indicate the operation of a radio receiver.

Radio receivers which have an active radio noise squelch circuit have circuit points where a voltage pulse signal can be applied to momentarily deactivate the squelch. In some of these receivers an external connection in the form of a test pin connection is provided, which can be used for applying the voltage pulse for the invention. In newly designed equipment, the application of this invention would be obvious.

Further objectives may be found in the following drawing, specification and claims.

BRIEF DESCRIPTION OF THE DRAWINGS

FIGS. 2A through 2H and 2J through 2L show the waveform/pulse timing of the signals generated using the invention when repetitive narrow pulses are applied directly to a squelch control connection test point when it is accessible in a radio receiver and which is the subject matter of the teachings of the co-pending parent U.S. patent application number 07/427,725 now U.S. Pat. No. 4,996,717.

FIGS. 2A through 2H and 2J through 2L show the waveform/pulse timing of the signals generated using the teachings of the present invention in the modification wherein there are no accessible squelch control test points for the radio noise squelch circuit system of a radio receiver or receivers and the aforesaid clock driven pulse source for each radio receiver is connected to provide repetitive short duration radio frequency signals (generated by a wide spectrum radio frequency generator reactively connected to the radio receiver's antenna) to disable momentarily that radio receiver's noise squelch circuit system at regular intervals.

DETAILED DESCRIPTION OF THE INVENTION

FIG. 1A and FIGS. 2A through 2H and 2J through 2L, depict the subject matter of U.S. patent application 07/427,725, filed Oct. 26, 1989 now U.S. Pat. No. 4,996,717.

FIG. 1B and FIGS. 2A through 2H and 2J through 2N and FIGS. 2A through 2N, depicts the subject matter of this U.S. continuation-in-part patent application.

Figure 1A:
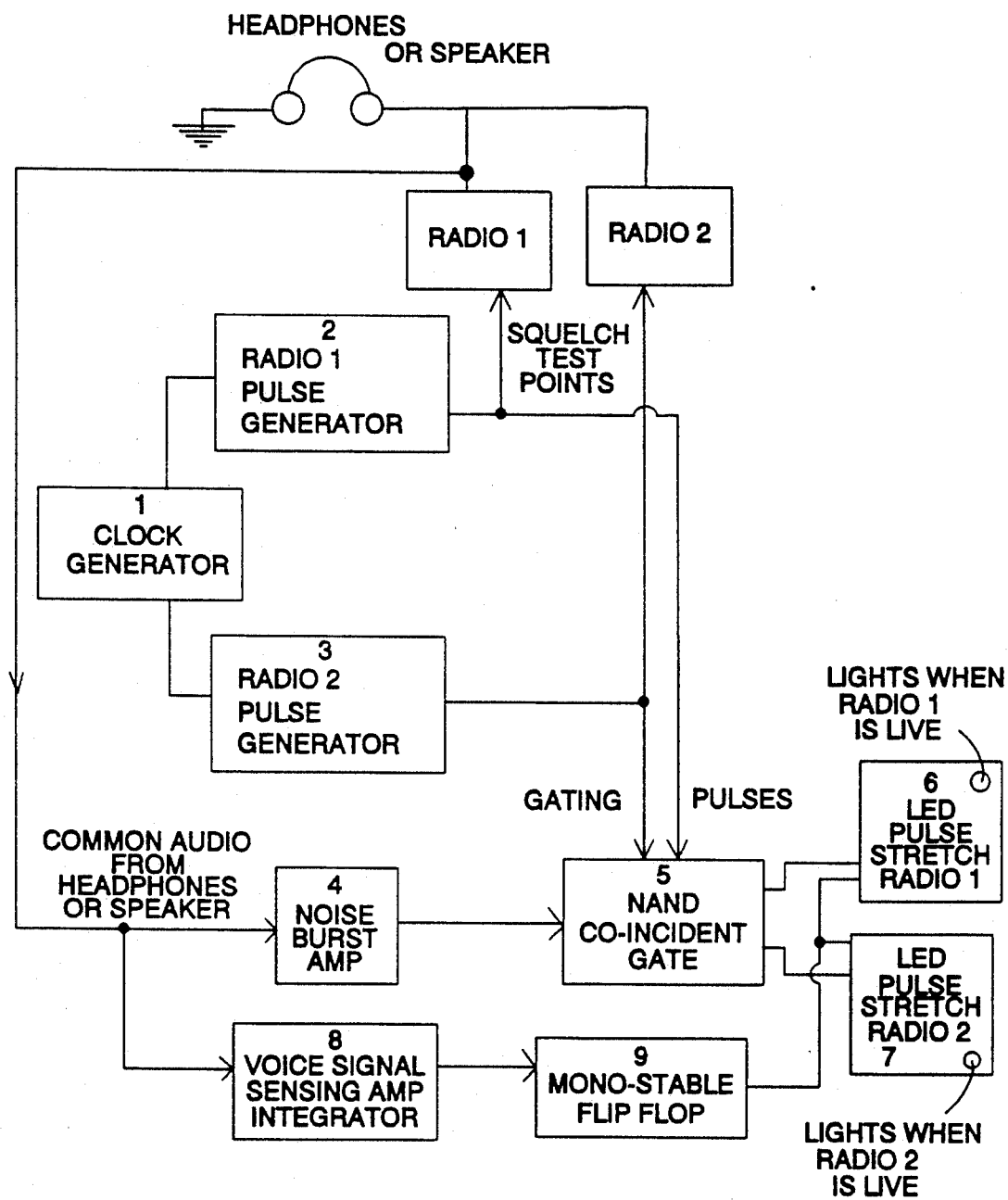
FIG. 1A is a block diagram of the circuitry of the prior parent invention using two radio receivers illustrating the application of the teaching of the present invention, when each of the radio receivers includes an active radio noise squelch circuit and a squelch control connection test point for receiving repetitive short pulses from a clock driven pulse source to deactivate momentarily said noise squelch circuit at regular intervals to provide repetitive, short noise pulses in the audio output of said radio receiver indicating that said radio receiver is operational and awaiting a radio frequency signal. Shown is the configuration for a common headphone/speaker line, and the light signals which aid as indicators.

Referring to FIG. 1A, the clock generator (Block 1) creates a rectangular symmetrical waveform of approximately two seconds, for example, between transitions (FIG. 2A). Radio 1 pulse generator (Block 2) is triggered when the transition goes from high to low, and generates a ten millisecond pulse (FIG. 2B) which is sent to deactivate momentarily the Radio 1 squelch circuit. Subsequent clock pulse transition from low to high triggers the Radio 2 pulse generator (Block 3). The output pulse pair (FIG. 2D) as likewise wired to the squelch circuit of Radio 2 to deactivate momentarily the squelch and pass the bursts of noise. These pulses are grouped to identify which radio is being checked; thus, double pulse is Radio 2 and single pulse is Radio 1.

The equipment as described above is adequate to perform the audible communication checking claimed in this invention, since the pilot or communicator can hear the periodic noise burst from the "de-squelch" pulses. Note that the squelch system of the radio keeps the radio silent when there is no signal.

This system may be enhanced with the use of indicator lights (shown in FIG. 1A). Blocks 4, 5, 6, 7 provide visual indication to show which radio or radios are live. A Light-Emitting Diode (LED) corresponding to each radio shows when a particular radio is adjusted for audible reception.

A noise burst amplifier (Block 4) "listens" on the headphone audio line for any sound. This line would be squelched silent with zero audio signal when no voice transmission was being received—if it were not for the pulsed noise bursts. Block 4 amplifies these noise bursts when heard at headphone level. The pulse, if present, is amplified and shaped in Block 4 and is passed to a NAND gate (Block 5). This gate passes the pulse on to Block 6 (Radio 1 LED light pulse stretch) if the noise burst pulse occurs co-incident with Radio 1 pulses. Similarly, if headphone noise pulses are co-incident with Radio 2 gating pulses, they are sent to Block 7 (LED pulse stretch for Radio 2).

If Radio 1 and Radio 2 pulses are heard on headphones co-incident with their respective gating pulses, BOTH lights will come on. Blocks 6 and 7 (LED pulse stretches), when triggered from the gate, turn on the LEDs for most of the four second period between similar pulses. This gives nearly continuous light indication to show which radio is live. The short period during which the indicator blinks dark in each period is a self-checking feature which shows that the light is dependent on the audio noise pulse and is therefore a valid indicator.

Blocks 8 and 9 disable both indicator lights when voice communication is being received. This is shown in FIGS. 2K and 2L. Voice reception would confuse the indication because voice audio signal is present at the sampling instants for the noise pulse checking. This circuit solves the trouble of both lights coming on erratically when voice is present by preventing either light from turning on when voice is present.

In an embodiment of this invention, Blocks 1-3, 5 and 6 in FIG. 1A are made up of integrated circuit (IC) chips of the "TIMER" classification, which are standard eight (8) pin chips. For compact packaging, dual or multiple units can be used. The economical type 555 or 556 have been used. Block 4 can be a 741 Op Amp IC and Block 5 a 7400 Quadrangle NAND Gate IC. Block 8 is an Op Amp IC such as a type 741; Block 9 is a Timer IC such as a type 555. These parts are illustrative only and are not limiting in any way.

In some receivers, each radio receiver having a radio noise squelch circuit, also contain a squelch test pin to which can be applied the repetitive voltage pulse signals to deactivate momentarily each radio's noise squelch circuit at regular intervals, to give indication that the said radio receiver is operational and awaiting a radio frequency signal. In those cases, the invention as described in FIG. 1A and depicted operationally using FIGS. 2A through 2H and 2J through 2L, may be added by connecting into the squelch test pins as shown. The prior parent invention of co-pending patent application number 07/427,725, now U.S. Pat. No. 4,996,717 may of course be appropriately wired into existing equipment or may obviously be made part of newly designed receiving equipment.

However, in those cases where each radio receiver has a noise squelch circuit system but does not have a squelch control connect test point, the user of the teachings of the present invention may modify each radio circuit to make access to the appropriate control test point inside the radio receiver and proceed to use the teachings of the present invention.

Alternatively, teachings of the present invention, may be practiced by connecting the aforesaid clock driven pulse source to provide repetitive short duration radio frequency signals (generated by a wide spectrum radio frequency generator reactively connected to the radio receiver's antenna) to overcome momentarily that radio receiver's noise squelch circuit system at regular intervals to give an indication that the said radio is operational and awaiting a radio frequency signal. The system is then modified from the type depicted in FIG. 1A to the system depicted in FIG. 1B. As used herein regarding the reactive coupling from the wide spectrum signal generator to the receiver, the words loose and light are used interchangeably to mean a low degree of electrical interconnection thereby.

Referring to FIG. 1A, the clock generator (Block 1) creates a rectangular symmetrical waveform of approximately two seconds between transitions (FIG. 2A). Radio 1 pulse generator (Block 2) is triggered when the transition goes from high to low, and generates a ten millisecond pulse (FIG. 2B) which is sent to deactivate momentarily the Radio 1 squelch circuit by a signal burst (wave form of FIG. 2M) from wide spectrum radio generator 10, which is lightly and reactively coupled to the antenna 14 of radio 1. Subsequent clock pulse transition from low to high triggers the Radio 2 pulse generator (Block 3). The output pulse pair (FIG. 2D) similarly deactivates momentarily the squelch circuit of Radio 2 by a signal burst (wave form of FIG. 2N) from wide spectrum radio generator 11 which is lightly and reactively coupled to antenna 15 of radio 2. One of the benefits of this system modification is that the connection between the radio receiver under test and its associated antenna is being tested along with the radio receiver itself. These radio frequency pulses are grouped to identify which radio is being checked; thus, double pulse is Radio 2 and single pulse is Radio 1.

The equipment, as described above, is adequate to perform the audible communication checking claimed in this invention, since the pilot or communicator can hear the periodic noise burst from the "de-squelch" pulses. Note that the squelch system of the radio keeps the radio silent when there is no signal.

Figure 1B:
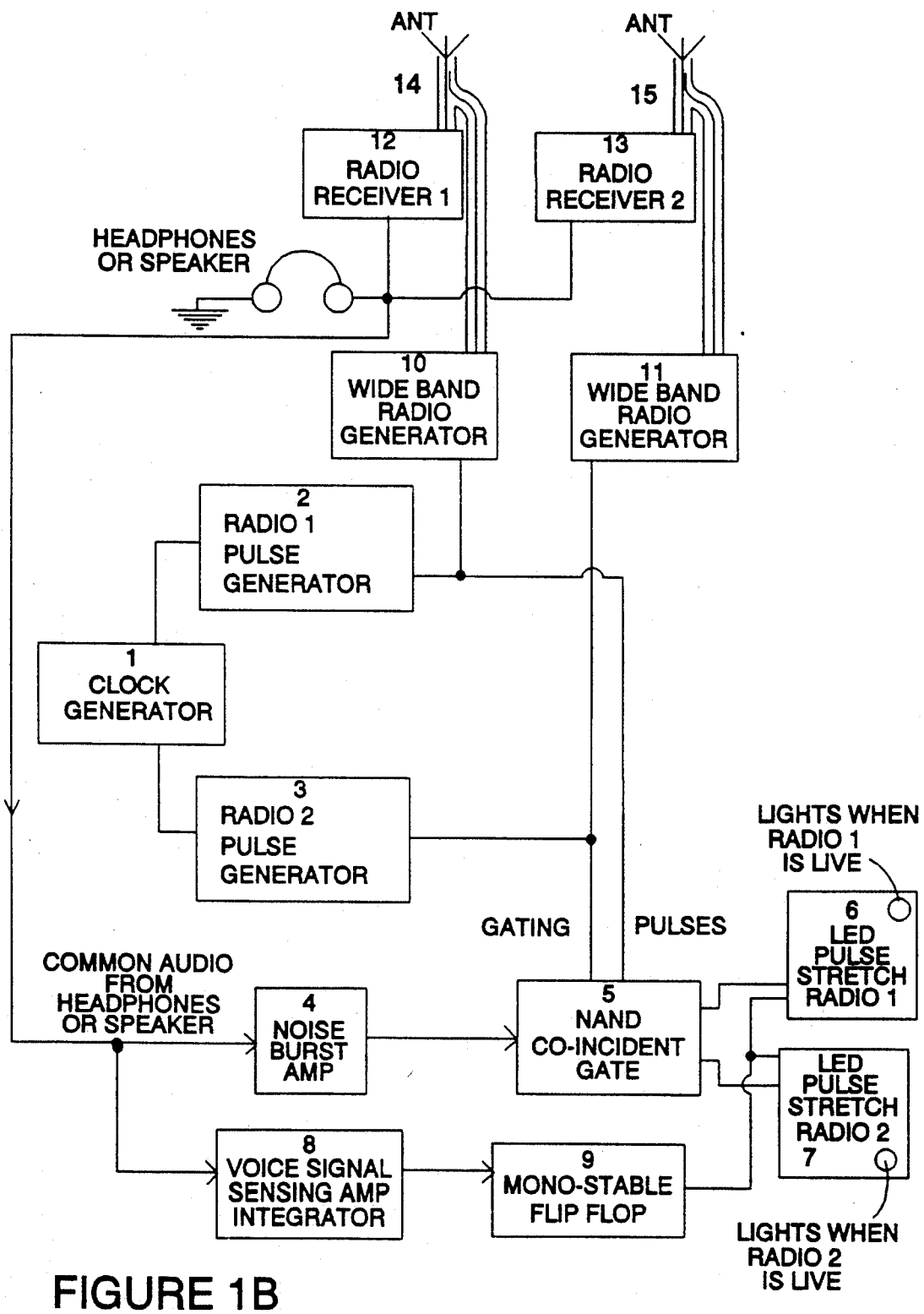
FIG. 1B is a block diagram of the circuitry of the present invention using two radio receivers illustrating a modification of the teachings of the invention of the aforesaid co-pending patent application and in those cases where each radio receiver has a noise squelch circuit system but does not have a squelch control connect test point, the aforesaid clock driven pulse source for each radio receiver is connected to provide repetitive short duration signals (generated by a wide spectrum radio frequency generator reactively connected to the radio receiver's antenna input) which serves to deactivate momentarily that radio receiver's noise squelch system at regular intervals. Shown is the configuration for a common headphone/speaker line, and the light signals which aid as indicators.

This system may be enhanced with the use of indicator lights (shown in FIG. 1B). Blocks 4, 5, 6, 7 provide visual indication to show which radio or radios are live. A Light-Emitting Diode (LED) corresponding to each radio shows when a particular radio is adjusted for audible reception.

A noise burst amplifier (Block 4) "listens" on the headphone audio line for any sound. This line would be squelched silent with zero audio signal when no voice transmission was being received—if it were not for the pulsed noise bursts. Block 4 amplifies these noise bursts when heard at headphone level. The pulse, if present, is amplified and shaped in Block 4 and is passed to a NAND gate (Block 5). This gate passes the pulse on to Block 6 (Radio 1 LED light pulse stretch) if the noise burst pulse occurs co-incident with Radio 1 pulses. Similarly, if headphone noise pulses are co-incident with Radio 2 gating pulses, they are sent to Block 7 (LED pulse stretch for Radio 2).

If Radio 1 and Radio 2 pulses are heard on headphones co-incident with their respective gating pulses, BOTH lights will come on. Blocks 6 and 7 (LED pulse stretches), when triggered from the gate, turn on the LEDs for most of the four second period between similar pulses. This gives nearly continuous light indication to show which radio is live. The short period during which the indicator blinks dark in each period is a self-checking feature which shows that the light is dependent on the audio noise pulse and is therefore a valid indicator.

Blocks 8 and 9 disable both indicator lights when voice communication is being received on a common audio line for plural receivers. This is shown in FIGS. 2K and 2L. Voice reception would confuse the indication because voice audio signal is present at the sampling instants for the noise pulse checking. This circuit solves the trouble of both lights coming on erratically when voice is present by preventing either light from turning on when voice is present.

For purpose of illustration of this invention, Blocks 1-3, 5 and 6 in FIG. 1B may be made up of integrated circuit (IC) chips of the "TIMER" classification, which are standard eight (8) pin chips. For compact packaging, dual or multiple units can be used. The economical type 555 or 556 have been used. Block 4 can be a 741 Op Amp IC and Block 5 a 7400 Quadrangle NAND Gate IC. Block 8 is an Op Amp IC such as a type 741; Block 9 is a Timer IC such as a type 555. These parts are illustrative only and are not limiting in any way.

A system, including two or more receivers, has been described hereinabove in reference to FIG. 1A and FIG. 1B as well as FIG. 2A through FIG. 2H and FIG. 2J through 2N. The teachings of the present invention would of course apply to a simpler form of the teachings of the present invention, which include a single receiver with its own headphone and/or speaker having an indicator light. The single receiver with its own speaker and/or headphone and/or indicator light would not require the co-incident gate (FIG. 1A, Block 5). With respect to the waveforms, FIGS. 2A, 2B, 2E, 2F and 2G would apply. The use of indicator lights as taught herein to sense the presence of audible sound pulses enhances the system by permitting infrequent noise bursts while yet giving continuing indication.

Figure 3:
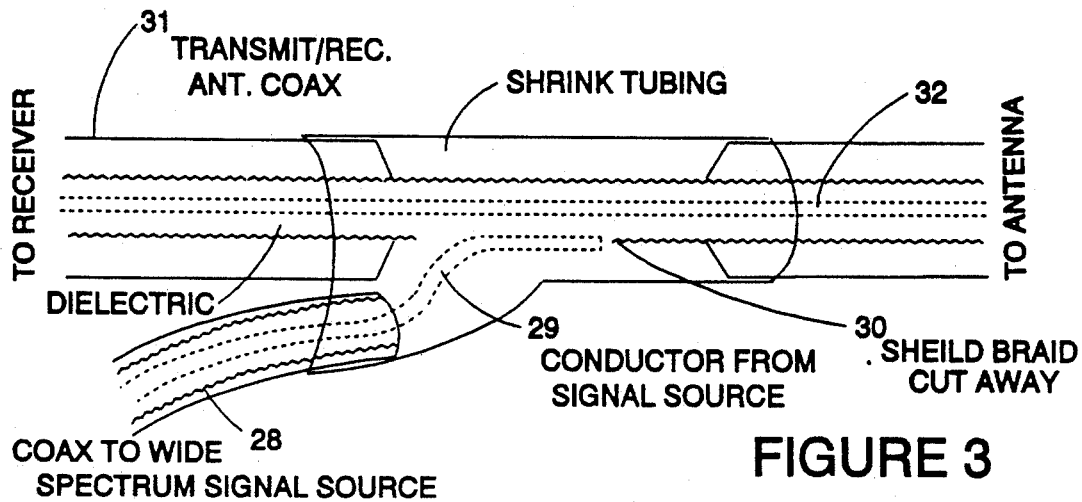
FIG. 3 shows, by way of example, more detail of how a wide spectrum radio frequency generator, such as 10 and/or 11 of FIG. 1A, may be coupled reactively to the antenna output of the radio receiver having a noise squelch circuit system.

FIG. 3, shows how the output of the wide spectrum radio generator might be lightly, reactively coupled to the antenna of one or more radio receivers. The coax output 28 of the wide spectrum radio generator is skinned to the conductor 29 which in turn is fixedly attached to a cut away portion 30 of the coaxial antenna lead but separated from the antenna center conductor 32 by its dielectric material. The antenna coax 31 is connected, at one end to the antenna and at the other end, it is connected to the receiver. This simple arrangement can be refined with additional overall shielding and isolation as would occur to one skilled in the art.

Figure 4:
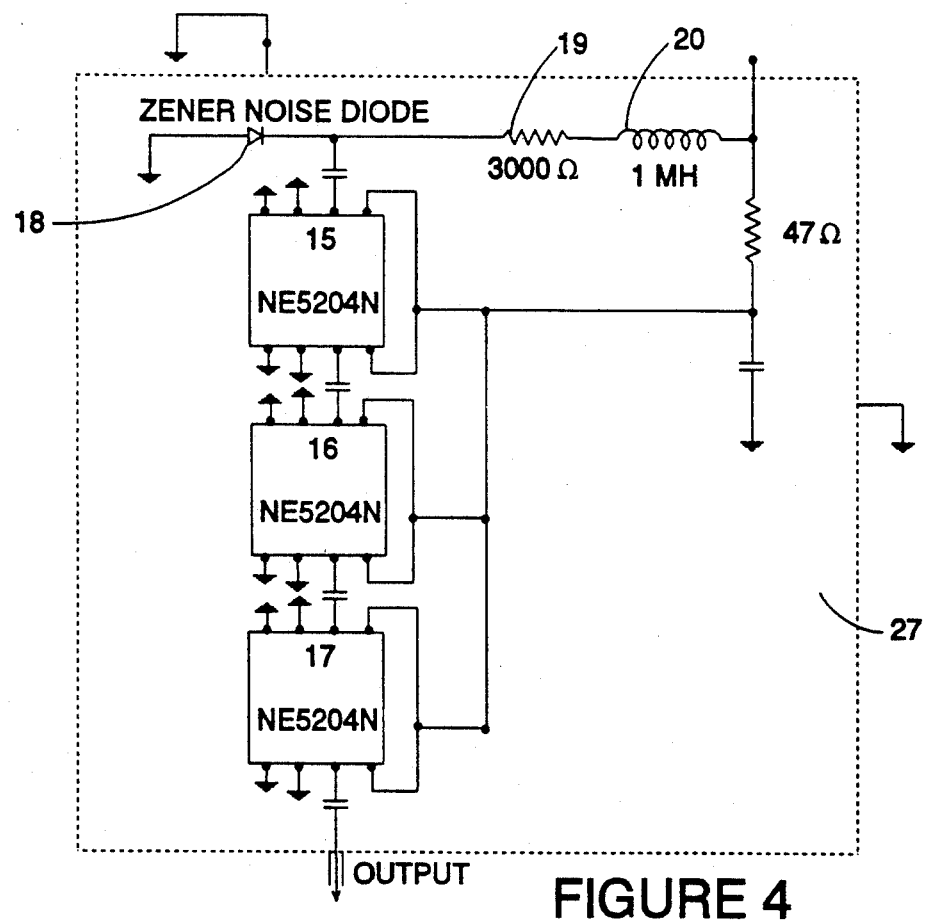
FIG. 4 shows, by way of example, a three stage IC amplifier circuit functioning as a wide band generator (White Noise) usable as the wide band radio frequency generator 10 and wide band radio frequency generator 11 of FIG. 1A, to function in accordance with the teachings of the present invention to provide the RF pulse signals shown in wave form of FIG. 2M and FIG. 2N.

FIG. 4, depicts a white noise, wide band spectrum signal generator 27 which may be used to generate the radio frequency pulses shown in wave forms FIG. 2M and FIG. 2N, the output from wide spectrum signal generators 10 and 11, of FIG. 1B. Such a generator should be selected to provide a wide spectrum signal capable of working with radio frequency receivers which are tuned to any frequencies used, including UHF and VHF frequencies. Such a white noise generator produces a pulsed radio signal which includes all frequencies and can be heard on all tuned radio frequencies. It uses the electrical noise generated by a zener diode which is then amplified by three stages of a mimic integrated circuit amplified as shown in FIG. 3. These are typically available from MDF Products, Inc. 7 Johnson Drive, Danbury, Conn., USA 06811-2927. Typical part number 224MDF802W-12. In FIG. 4, the integrated circuit amplifiers are identified as 15, 16 and 17 respectively and the zener diode resister and inductor are identified by numerals 18, 19, and 20. The grounded chassis is identified by numeral 27. The wide spectrum signal generator might alternately be a composite transistor oscillator and be based on a circuit described by Forrest M. Mimms III in his published book, ENGINEER'S MINI NOTEBOOK, sold by Radio Shack, catalog no. 276-5015, pages 42 and 43 entitled "Transistor RF Transmitter".

The foregoing description has been directed to particular embodiments of the invention in accordance with the requirements of the Patent Statutes for the purposes of illustration and explanation. It will be apparent, however, to those skilled in this art that many modifications and changes will be possible without departure from the scope and spirit of the invention. It is intended that the following claims be interpreted to embrace all such modifications.

What is claimed is:

1. The radio receiver operational checking system comprising in combination:
    a) a radio receiver including an active radio noise squelch circuit, set at a level to eliminate ambient noise (atmospheric and receiver noise) when no radio signal is being received, and including its antenna connected thereto being adapted to be reactively coupled to a clock-driven pulsed radio frequency source such that the squelching is momentarily disabled thereby; and
    b) the clock-driven pulse source, for said radio receiver providing repetitive short radio frequency test pulses for loose reactive coupling through said antenna into said radio receiver to deactivate momentarily said noise squelch circuit at regular intervals causing repetitive, short audible noise pulses to be heard from the said radio receiver indicating that said radio receiver is operational and awaiting a radio frequency signal.

2. The radio receiver operational checking system of claim 1 further comprising in combination light indicating means associated with the said receiver to monitor visually the presence of audio noise output from the said receiver, thus visually showing the radio receiver as being operational.

3. The radio receiver operational checking system of claim 1 further comprising light indicating means for said radio receiver to turn on when said short audible noise pulse appears in an output from the receiver and to turn on when said short noise pulse output of said receiver coincides with the short radio frequency pulses from the clock-driven pulse source as an indication of the operability and adequate loudness adjustment of said receiver.

4. The radio receiver operational checking system of claim 1 wherein there are a plurality of radio receivers and a clock-driven differing pulse source for each of said radio receivers.

5. One radio receive operational checking system of claim 4, where one headphone or speaker output line is used for the plural radio receivers.

6. The radio receiver operational checking system of claim 4 wherein said clock-driven differing pulse sources are spaced in time and waveform such that the sounds heard from the radio receivers are audibly distinguishable from each other to identify each radio receiver for verifying its operation.

7. The radio receiver operational checking system of claim 6 further comprising light indicating means for each of said radio receivers to monitor visually if the short audible noise pulses are present from said receivers, and to turn on when the short audible noise pulses from said receivers coincide with the short radio frequency pulses from said clock-driven differing pulse sources as an indication of the operability of said receivers.

8. The radio receiver operational checking system of claim 6 further comprising audio signal responsive means for switching off a light indicating means for each of said receivers when either of said receivers is receiving a modulated radio signal.

9. Method for checking the operational status of at least one radio receiver having an active squelch circuit and an associated radio antenna source, comprising the steps of:
    a) applying repetitive short pulses to a squelch control point being of sufficiently short duration, as to have a de minimus effect on a radio operator;
    b) applying said repetitive short pulses to said radio receiver to deactivate the squelch circuit at regular intervals by applying said repetitive short pulses by loose reactive coupling into the antenna source of said radio receiver.

10. The method for checking the operational status of the at least one radio receiver having the active squelch circuit and the associated radio antenna source, as in claim 9, further comprising an additional step of:
    c) applying short noise bursts from said radio receiver to turn on a light, indicating that said radio receiver is operational and awaiting a radio frequency signal.

11. Method of checking the operational status of a plurality of radio receivers, each having an active squelch circuit and each radio receiver having an associated antenna source and which may have common audio output line connections, comprising the steps of:
 a) from separate, coordinated pulse sources, applying repetitive, identifiable wide band radio frequency noise pulses via loose reactive coupling through the associated antenna to deactivate squelching action at regular intervals;
 b) making said repetitive short radio frequency pulses, to each of said receivers through the associated antennas, distinguishable in time and waveform such that a audible output of each of said radio receivers is audibly distinguishable from each other;
 c) producing corresponding repetitive, short, identifiable audible noise bursts in the audible output of said radio receivers, to indicate which of said radio receivers are operational and awaiting a radio frequency signal; and
 d) said repetitive radio frequency pulses being of sufficiently short duration, so as to have a de minimus effect on the radio operator when present.

12. The method of claim 11 further comprising the additional steps of applying said repetitive, radio frequency pulses to light indicating means to indicate that said radio receivers are operational and awaiting radio frequency signals, wherein said light indicating means is normally off, but, in response to said repetitive, radio frequency pulses, is switched on.

13. The method of claim 12 when having a single speaker/headphone line for multiple receivers, further comprising the additional step of applying an audio signal responsive means to switch off said light indicating means for each of said receivers when either of said receivers is receiving a voice or tone modulated radio signal.

* * * * *